United States Patent
Jiang et al.

(10) Patent No.: US 10,447,309 B2
(45) Date of Patent: Oct. 15, 2019

(54) RS ERROR CORRECTION DECODING METHOD

(71) Applicant: FUJIAN LANDI COMMERCIAL EQUIPMENT CO., LTD., Fuzhou, Fujian (CN)

(72) Inventors: Shengzhang Jiang, Fujian (CN); Weidong Wu, Fujian (CN); Mingwei Wang, Fujian (CN)

(73) Assignee: FUJIAN LANDI COMMERCIAL EQUIPMENT CO., LTD., Fuzhou (CN)

( * ) Notice: Subject to any disclaimer, the term of this patent is extended or adjusted under 35 U.S.C. 154(b) by 33 days.

(21) Appl. No.: 15/871,939

(22) Filed: Jan. 15, 2018

(65) Prior Publication Data

US 2018/0138926 A1    May 17, 2018

Related U.S. Application Data

(63) Continuation of application No. PCT/CN2016/091012, filed on Jul. 22, 2016.

(30) Foreign Application Priority Data

Jul. 31, 2015    (CN) .......................... 2015 1 0461188

(51) Int. Cl.
  *H03M 13/00* (2006.01)
  *H03M 13/15* (2006.01)

(52) U.S. Cl.
  CPC ..... *H03M 13/1515* (2013.01); *H03M 13/157* (2013.01); *H03M 13/158* (2013.01);
  (Continued)

(58) Field of Classification Search
  CPC ........... H03M 13/151; H03M 13/1515; H03M 13/6516; H03M 13/1585; H03M 13/159;
  (Continued)

(56) References Cited

U.S. PATENT DOCUMENTS

| 4,597,083 | A | * | 6/1986 | Stenerson | ............. | H03M 13/15 714/753 |
| 4,821,268 | A | * | 4/1989 | Berlekamp | ......... | H03M 13/453 714/784 |
| 4,839,896 | A | * | 6/1989 | Glover | ................ | H03M 13/151 714/759 |

(Continued)

FOREIGN PATENT DOCUMENTS

CN    1303763 C    3/2007

*Primary Examiner* — Albert Decady
*Assistant Examiner* — Osman M Alshack (57) ABSTRACT

A decoding method includes that when encoding at a sending terminal, for a m-order primitive polynomial P(x), a primitive field element in galois field $GF(2^m)$ is represented by $\alpha$; a lookup table $f(\alpha^j)$ for different power exponents of $\alpha$ is established, where the value of j is selected from all the integers ranging from 0 to $2m-1$, with a total number of $2m$; a generator polynomial G(x) is expanded to obtain a polynomial with respect to x, with coefficients being an addition or subtraction of the power exponents of $\alpha$; a remainder polynomial R(x), obtained by dividing code word polynomial Q(x) by the generator polynomial G(x), is a polynomial with respect to x, with coefficients being an addition or subtraction of the power exponents of $\alpha$; and the coefficients of the generator polynomial G(x) and the remainder polynomial R(x) are both calculated using data found in the lookup table $f(\alpha^j)$.

5 Claims, 2 Drawing Sheets

(52) U.S. Cl.
CPC ..... *H03M 13/159* (2013.01); *H03M 13/1525* (2013.01); *H03M 13/1585* (2013.01); *H03M 13/617* (2013.01); *H03M 13/6516* (2013.01)

(58) Field of Classification Search
CPC ............ H03M 13/158; H03M 13/617; H03M 13/157; H03M 13/1525; H04L 1/0057; G06F 2207/5354; G11B 20/1833; G11B 2020/1836
USPC .................. 714/752, 781, 784, 759
See application file for complete search history.

(56) References Cited

U.S. PATENT DOCUMENTS

| | | | | |
|---|---|---|---|---|
| 7,103,830 | B1* | 9/2006 | Dong .................... | H03M 5/145 714/781 |
| 8,225,185 | B1* | 7/2012 | Tang .................... | H03M 13/153 714/781 |
| 2003/0021365 | A1* | 1/2003 | Min ...................... | H04L 1/0001 375/343 |
| 2003/0103582 | A1* | 6/2003 | Linsky ................. | H04L 1/0045 375/327 |
| 2003/0140301 | A1* | 7/2003 | Litwin, Jr. ........ | G11B 20/10296 714/784 |
| 2009/0199075 | A1* | 8/2009 | Demjanenko ....... | H03M 13/158 714/784 |
| 2011/0153701 | A1* | 6/2011 | Moudgill ................ | G06F 7/724 708/209 |
| 2013/0073925 | A1* | 3/2013 | Mizushima ......... | H03M 13/152 714/763 |
| 2014/0068391 | A1* | 3/2014 | Goel .................. | H03M 13/152 714/785 |

\* cited by examiner

RS ERROR CORRECTION DECODING METHOD

CROSS REFERENCE TO RELATED APPLICATIONS

The present application is a Continuation Application of PCT Application No. PCT/CN2016/091012 filed on Jul. 22, 2016, which claims the benefit of Chinese Patent Application No. 201510461188.4 filed on Jul. 31, 2015. All the above are hereby incorporated by reference.

FIELD OF THE INVENTION

The present invention relates to the technical field of error correction codes, and in particular to a Reed-Solomon (RS) error correction decoding method.

BACKGROUND OF THE INVENTION

In a communication system, it is necessary to artificially add redundant codes to the data stream according to certain rules before information is sent so that a receiving terminal can detect and correct error codes. RS error correction code is currently one of the most effective and widely used error control encoding measures. RS codes can be used to correct random errors, and are also suitable for correcting burst errors, and have been widely used in areas such as satellite communications, digital television transmission or the like.

(c, k, 2t) are typically used to represent RS codes; where c is the total length of information data and redundant code, k is the length of the information data, 2t is the length of the redundant code, and t is the maximum number of errors that can be corrected, where c=K+2t.

The number of elements in the Galois field (GF) in the conventional RS error correction algorithm is related to the number of primitive polynomials. For example, if the order of a primitive polynomials is 8, then the number of elements in the GF is $2^8$, i.e., 256, the elements in the GF are used for a lookup table in the RS error correction calculation process, and the number of elements in the lookup table reaches 256; and if the order of a primitive polynomial is 16, then the number of elements in the GF is $2^{16}$, i.e., 65536, which occupies more memory space, and therefore the speed of data processing is slow and the application thereof is limited. In addition, if the number of actual error code words exceeds the error correction capacity, a situation that more errors occur as the error correction proceeds may arise.

In addition, in conventional RS error correction algorithms, the error codes are not checked after being found and corrected, so the stability and correctness of the system is not high.

Chinese invention patent publication No. CN1303763C discloses a method for reducing the complexity of encoding and decoding RS codes. The invention has the following main features: when encoding at a sending terminal, the code element of the RS code is represented by the power of the primitive field element $\alpha$, and code words of the RS codes are all in the finite field $GF(2^m)$, and all non-zero elements in the finite field $GF(2^m)$ are integer powers of the primitive field element $\alpha$. In coding and decoding, for any two elements X and Y in the finite field $GF(2^m)$, multiplication of X and Y equals to addition of the corresponding two exponents, and the addition and subtraction of X and Y are performed using a lookup table. In this way, the coding and decoding method is improved based on existing RS coding and decoding algorithms, the complicated multiplication operation can be avoided and the coding and decoding speed is improved. However, for the finite field $GF(2^m)$, three lookup tables have to be established, i and x' in each group are stored in two long lookup tables, power [ ] and index [ ], and there is a further lookup table f(s), where s is selected from all the integers ranging from 0 to $2^m-1$, with a total number of $2^m$. While the calculation speed is fast, the data memory occupied is relatively large, and after the RS error codes are corrected using the redundant codes, no valid data are used for checking, resulting in low security and stability.

SUMMARY OF THE INVENTION

The technical problem to be addressed by the present invention is to provide a RS error correction decoding method which occupies less memory.

In order to address the above technical problem, the invention provides the following technical solutions:

A RS error correction decoding method, in which, when encoding at a sending terminal, code words of information data are represented by $K_l$, code words of redundant codes are represented by $T_n$, the order of primitive polynomial P(x) is m, a generator polynomial in $GF(2^m)$ is G(x), and an error correction code is represented by (c, k, t), wherein c is the total length of the information data and the redundant code, k is the length of the information data, and t is the length of the redundant code, then the code word polynomial Q(x) can be represented as $$Q(x) = \sum_{l=t}^{t+k-1} K_l \cdot x^l + \sum_{n=0}^{t-1} T_n \cdot x^n;$$

root of the m-order primitive polynomial P(x) is primitive field element in $GF(2^m)$, and the primitive field element is represented by $\alpha$, thus the generator polynomial G(x) can be represented as $$G(x) = \prod_{i=1}^{t}(x - \alpha^i);$$

a lookup table $f(\alpha^j)$ is established for different power exponents of $\alpha$, wherein the value of j is selected from all the integers ranging from 0 to 2m−1, with a total number of 2m;

the generator polynomial G(x) is expanded to obtain a polynomial with respect to x, wherein the coefficients of the generator polynomial G(x) are the addition or subtraction of the power exponents of $\alpha$;

numerical values of the different power exponents of $\alpha$ are found out through the lookup table $f(\alpha^j)$ and the coefficients of the generator polynomial G(x) are calculated;

it is assumed that the code words $T_n$ of the redundant codes are all 0, then a code word polynomial $$Q(x) = \sum_{l=t}^{t+k-1} K_l \cdot x^l$$

is obtained;

the code word polynomial Q(x) is divided by the generator polynomial G(x) to obtain a remainder polynomial $$R(x) = \sum_{i=0}^{2s} T_i \cdot x_i;$$

the coefficients Ti of R(x) are the addition or subtraction of the power exponents of α; numerical values of the power exponents of α are found out through the lookup table f(α$^j$), and the coefficients of the remainder polynomial R(x) are calculated, namely, the code words Tn of the redundant codes.

The invention has the following advantageous effects: a lookup table f(α$^j$) consisting of 2m exponents of the primitive field element α is established in the finite field GF(2$^m$) to calculate the coefficients of the generator polynomial G(x) and the coefficients of the remainder polynomial R(x) obtained by dividing the code word polynomial Q(x) by the generator polynomial G(x), and the number of data in the lookup table f(α$^j$) is greatly reduced, thus saving a great deal of system memory and improving the flexibility and convenience in applying the RS error correction algorithm.

DETAILED DESCRIPTION OF THE
PREFERRED EMBODIMENTS

The disclosure, objects and effects of the present invention will be described in detail below with reference to the embodiments and accompanying drawings.

The critical concept of the present invention is to establish a lookup table f(α$^j$) for different power exponents of α for a m-order primitive polynomial P(x), where j is selected from all the integers ranging from 0 to 2m−1, with a total number of 2m, for the calculation of coefficients of a generator polynomial G(x) and coefficients of a remainder polynomial R(x) obtained by dividing a code word polynomial Q(x) by the generator polynomial G(x), thus greatly saving the system memory; and a redundant code is additionally taken during encoding, for checking the data obtained by error correction decoding so as to improve system correctness and stability.

The technical term involved in the present invention is explained in Table 1:

TABLE 1

| Technical term | Interpretation |
|---|---|
| polynomial representation | A number is represented by a sum of a group of bases (1, α, α$^2$, ... , α$^{n-1}$), and the group of bases are referred to as standard bases |

Figure 1:
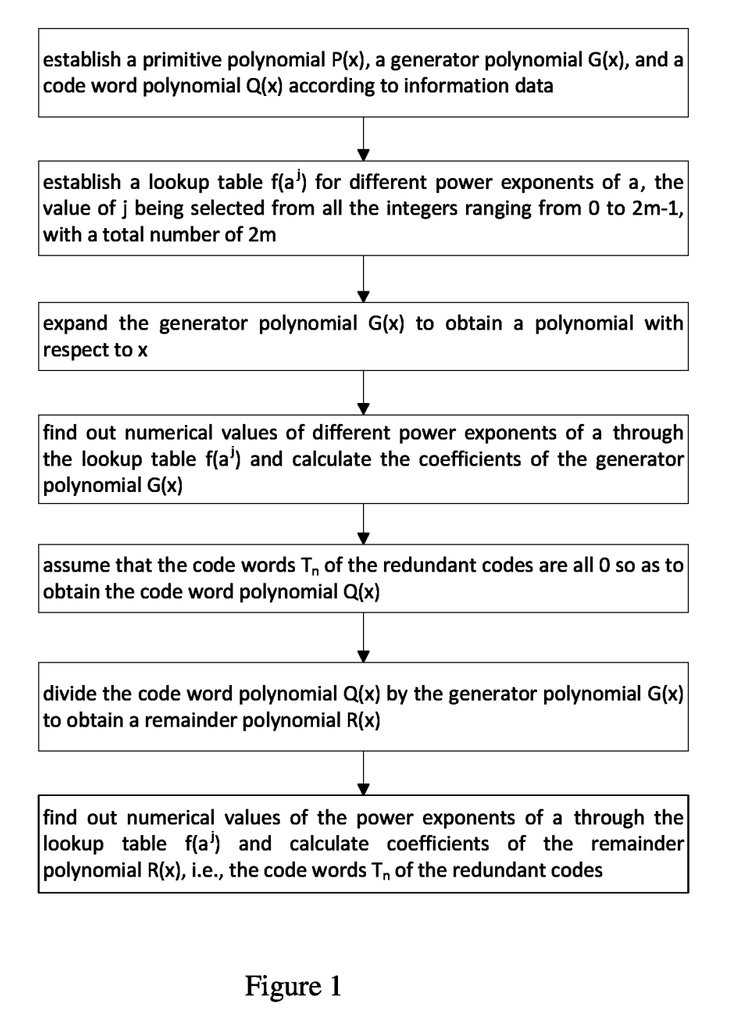
FIG. 1 is a flowchart of performing RS encoding by a sending terminal according to a first embodiment of the present invention.
Figure 2:
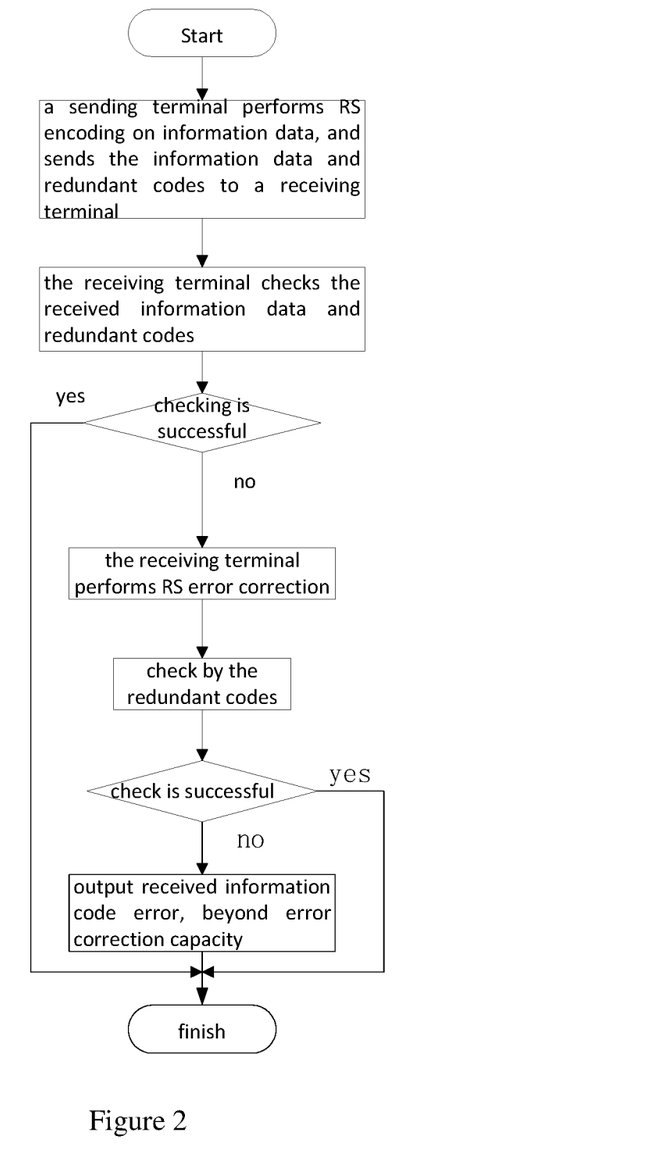
FIG. 2 is a flowchart of RS encoding and error correction according to the first embodiment of the present invention.

Referring to FIG. 1 and FIG. 2, a specific embodiment of the present invention is described as follows.

A RS error correction decoding method is provided, in which, when encoding at a sending terminal, code words of information data are represented by K$_l$, code words of redundant codes are represented by T$_n$, the order of primitive polynomial P(x) is m, a generator polynomial in GF(2$^m$) is G(x), and an error correction code is represented by (c, k, t), wherein c is the total length of the information data and the redundant code, k is the length of the information data, and t is the length of the redundant code, then the code word polynomial Q(x) can be represented as $$Q(x) = \sum_{l=t}^{t+k-1} K_l \cdot x^l + \sum_{n=0}^{t-1} T_n \cdot x^n;$$

root of the m-order primitive polynomial P(x) is primitive field element in GF(2$^m$), and the primitive field element is represented by α, thus the generator polynomial G(x) can be represented as $$G(x) = \prod_{i=1}^{t} (x - a^i);$$

a lookup table f(α$^j$) is established for different power exponents of α, wherein the value of j is selected from all the integers ranging from 0 to 2m−1, with a total number of 2m;

the generator polynomial G(x) is expanded to obtain a polynomial with respect to x, wherein the coefficients of the generator polynomial G(x) are the addition or subtraction of the power exponents of α;

numerical values of the different power exponents of α are found out through the lookup table f(α$^j$) and the coefficients of the generator polynomial G(x) are calculated;

it is assumed that the code words T$_n$ of the redundant codes are all 0, then a code word polynomial $$Q(x) = \sum_{l=t}^{t+k-1} K_l \cdot x^l$$

is obtained;

the code word polynomial Q(x) is divided by the generator polynomial G(x) to obtain a remainder polynomial $$R(x) = \sum_{i=0}^{2s} T_i \cdot x_i;$$

the coefficients Ti of R(x) are the addition or subtraction of the power exponents of α; numerical values of the power exponents of α are found out through the lookup table f(α$^j$), and the coefficients of the remainder polynomial R(x) are calculated, namely, the code word Tn of the redundant codes.

Further, the error correction decoding process is described as follows:

it is assumed that s is the maximum number of error correction bits of a receiving terminal, let t=2s+1;

the code word polynomial Q(x) is divided by the generator polynomial G(x) to obtain the remainder polynomial R(x), $$R(x) = \sum_{i=0}^{2s} T_i \cdot x_i;$$

the coefficients of the remainder polynomial R(x) are calculated, thus obtaining the code words $T_n$ of 2s+1 redundant codes, n=1, 2, . . . , 2s+1;

the sending terminal sends information data and 2s+1 redundant codes to the receiving terminal;

the receiving terminal receives the information data and 2s+1 redundant codes;

the receiving terminal obtains the code word polynomial Q(x) by coding according to the received information data and 2s+1 redundant codes, and the code word polynomial Q(x) is represented as $$Q(x) = \sum_{l=2s+1}^{2s+k} K_l \cdot x^l + \sum_{n=0}^{2s} T_n \cdot x^n;$$

the receiving terminal calculates 2s+1 correctors $S_i$, where $S_i = Q(\alpha^i)$, i=1, 2, . . . , 2s+1;

a location and a correction value of error information code are calculated using correctors $S_1$ to $S_{2s}$ if not all of the correctors $S_i$ are equal to 0;

the correction value is added to the code word at the location of the error information code received by the receiving terminal to obtain an error-corrected code word;

the value of the error-corrected code word is assigned to the code word at the location of the error information code;

$S_{2s+1} = Q(\alpha^{2s+1})$ is recalculated, and if $S_{2s+1}=0$, the error correction is successful, and if $S_{2s+1} \neq 0$, received information code error is output and the error correction capacity is insufficient for this.

As can be seen from the above description, 2s+1 redundant codes are obtained when the $0^{th}$ power of x is taken in calculating the redundant codes, and after the error correction codes are calculated using the $1^{st}$ to the $2s^{th}$ redundant codes, the $(2s+1)^{th}$ redundant code is used to check whether the error-corrected code word polynomial is correct. In this way, the correctness of the error correction operation is effectively ensured, and the stability of system operation is improved.

Further, in the process of obtaining the remainder polynomial R(x) by dividing the code word polynomial Q(x) by the generator polynomial G(x), multiplication of the coefficients of x will be performed, and the multiplication is converted into addition in operation as follows.

the coefficients of x are represented by a polynomial representation;

the coefficients represented by the polynomial representation are multiplied and expanded to obtain addition of different power exponents of $\alpha$;

the numerical values of the different power exponents of $\alpha$ are found out by looking up the lookup table $f(\alpha^j)$ so as to solve the addition.

Further, the specific process of calculating the location of the error information code using the correctors $S_1$ to $S_{2s}$ is described as follows:

a calculation is performed based on the correctors to obtain an equation taking the location of the error information code as a root;

the root of the equation is represented by a polynomial representation, with standard bases being different power exponents of $\alpha$ and coefficients being values of $X_i$, where i=0, 1, . . . , m;

the coefficients of the equation are represented by a polynomial representation, with standard bases being different power exponents of $\alpha$;

the root and coefficients represented by the polynomial representations are brought into the polynomial of the equation;

let the coefficient of each term of the polynomial be zero, thus obtaining a non-homogeneous linear equations set for $x_i$;

the non-homogeneous linear equation set is solved to obtain the value of $x_i$;

the value of $x_i$ is brought into the root represented by the polynomial representation to calculate the root of the equation and obtain the location of the error information code;

the location in the code word polynomial Q(x) corresponding to the location of the error information code is looked for.

Further, looking for the location in the code word polynomial Q(x) corresponding to the location of the error information code is specifically as follows:

a numerical value that is the same as the value of the error information code is looked for in the lookup table $f(\alpha^j)$, and the coefficient at the location where the exponent value of x in the polynomial Q(x) is equal to the exponent value of $\alpha$ corresponding to the numerical value is the location in the code word polynomial Q(x) corresponding to the error information code;

if the numerical value that is the same as the value of the error information code is not found in the lookup table $f(\alpha^j)$, the following method is used to find out the location of the error information code, specifically:

in step S1, take p=2*m-1=31, v=$\alpha^{2m-1}$;

in step S2, let p=p+1;

in step S3, if the highest data bit of v is 1, v is firstly shifted leftward by 1 bit, and then v=v+$v_0$, where $v_0$ is the numerical value obtained by bringing x=$\alpha$ into the primitive polynomial P(x) except for the term of the highest power of x;

if the highest data bit of v is 0, v is shifted leftward by 1 bit;

in step S4, the v obtained in step S3 is compared with the error information code to see if they are equal:

if the v is equal to the error information code, the coefficient corresponding to the $p^{th}$ power of x in the code word polynomial Q(x) is the location of the error information code; and If the v is not equal to the error information code, then turn to step S2 to continue the process.

Further, using the correctors $S_1$ to $S_{2s}$ to calculate the correction value is specifically as follows:

a equation set consisting of the location of the error information code and the correction value is obtained, where the error information code is the root of the equation set, and the correction value is an unknown number of the equation set;

the correction value of the equation set is represented by the polynomial representation, with standard bases being different power exponents of $\alpha$, and coefficients being values of $x_i$, i=0, 1, . . . , m;

the location of the error information code of the equation set is represented by the polynomial representation, with standard bases being different power exponents of $\alpha$;

the correction value and coefficients represented by the polynomial representation are brought into the polynomial of the equation set;

let the coefficient of each term of the polynomial be zero, thus obtaining a non-homogeneous linear equation set for $x_i$;

the non-homogeneous linear equation set is solved to obtain the value of $x_i$;

the value of $x_i$ is brought into the correction value represented by the polynomial representation so as to calculate the root of the equation set and obtain the correction value.

It can be seen from the above description that in the process of error correction decoding of RS operation, the coefficients and unknown numbers of polynomials are all represented by the polynomial representation, thus the multiplication operation can be converted into addition operation, and solving of equation or equation set can be converted into solving of the non-homogeneous linear equation set so that the complicated operations are simplified, and the calculation process is simplified. The requirements on hardware are reduced, and the correctness of system operation is improved. If the numerical value that is being looked for is beyond the numerical value range of the lookup table $f(\alpha^j)$, the numerical value can be calculated by exponential operation. Since the data beyond the numerical value range of the lookup table $f(\alpha^j)$ is less in the process of RS error correction decoding, only 2m data are established in the lookup table $f(\alpha^j)$, and the memory consumption is therefore reduced.

Referring to FIG. 1 and FIG. 2, the first embodiment of the present invention is described as follows.

A RS error correction decoding method is provided, in which when encoding at a sending terminal, five code words of information data, 0x1234, 0x5678, 0x3245, 0xabcd, 0xef10, are represented by $K_l$, l=5, and the primitive polynomial is $P(x)=x^{16}+x^5+x^3+x^2+1$, the order of the primitive polynomial is 16, and for a generator polynomial in the $GF(2^{16})$, k is the length of information data, then, k is 5, t is the length of the redundant code, s is the maximum number of error correction bits by the receiving end and is 2; when taking t=2s+1, then t=5, c is the total length of the information data and the redundant code and is 10, the error correction code is represented by (c, k, t), then (c, k, t) is (10, 5, 5), $T_n$ represents the code words of the redundant codes, n=1, 2, . . . , 5, then the code word polynomial Q(x) can be represented as $$Q(x) = \sum_{l=t}^{t+k-1} K_l \cdot x^l + \sum_{n=0}^{t-1} T_n \cdot x^n;$$

a root of the 16-order primitive polynomial P(x) is a primitive field element in $GF(2^{16})$, and the primitive field element is represented by $\alpha$, then the generator polynomial G(x) can be represented as $$G(x) = \prod_{i=1}^{5} (x - \alpha^i);$$

a lookup table $f(\alpha^j)$ for different power exponents of $\alpha$ is established, where the value of j is selected from all the integers ranging from 0 to 31, with a total number of 2m, specifically:

{1,2,4,8,0x10,0x20,0x40,0x80,0x100,0x200,0x400, 0x800, 0x1000,0x2000,
0x4000,0x8000,0x2d,0x5a,0xb4,0x168.0x2d0,0x5a0, 0xb40,0x1680,0x2d00,
0x5a00,0xb400,0x682d,0xd05a,0xa099,0x411f,0x823e};

the generator polynomial G(x) is expanded to obtain a polynomial with respect to x, where the coefficients of the generator polynomial G(x) are addition or subtraction of the power exponents of $\alpha$, specifically:

$$G(x) = \prod_{i=1}^{5}(x-\alpha^i) = (x-\alpha)(x-\alpha^2)(x-\alpha^3)(x-\alpha^4)(x-\alpha^5) =$$
$$x^5 + (\alpha+\alpha^2+\alpha^3+\alpha^4+\alpha^5)x^4 + (\alpha^3+\alpha^4+\alpha^8+\alpha^9)x^3 +$$
$$(\alpha^7+\alpha^8+\alpha^{11}+\alpha^{12})x^2 + (\alpha^{10}+\alpha^{11}+\alpha^{12}+\alpha^{13}+\alpha^{14})x+\alpha^{15};$$

numerical values of the different power exponents of $\alpha$ are found out through the lookup table $f(\alpha^j)$ and the coefficients of the generator polynomial G(x) are calculated, specifically:

$G(x)=x^5+0x3e*x^4+0x318*x^3+0x18c0*x^2+0x7c00*x+$ 0x8000 it is assumed that each code word $T_n$ of the redundant codes is 0, then the code word polynomial $$Q(x) = \sum_{l=t}^{t+k-1} K_l \cdot x^l$$

is obtained, specifically:

$Q(x)=0x1234*x^9+0x5678*x^8+0x3245*x^7+0xabcd*x^6+$ $0xef10*x^5+0*x^4+0*x^3+0*x^2+0*x^1+0*x^0$ the code word polynomial Q(x) is divided by the generator polynomial G(x) to obtain a remainder polynomial $$R(x) = \sum_{i=0}^{2s} T_i \cdot x_i.$$

In calculating the remainder polynomial R(x), multiplication of coefficients of x will be performed, and the multiplication operation is converted into addition operation, specifically:

0x1234*0x18c0 is taken as an example;

the coefficients of x in the code word polynomial Q(x) and the generator polynomial G(x) are represented by a polynomial representation, specifically:

$0x1234=0*\alpha^{15}+0*\alpha^{14}+0*\alpha^{13}+1*\alpha^{12}+0*\alpha^{11}+0*\alpha^{10}+$
$1*\alpha^9+0*\alpha^8+0*\alpha^7+0*\alpha^6+1*\alpha^5+1*\alpha^4+0*\alpha^3+$
$1*\alpha^2+0*\alpha^1+0*\alpha^0=\alpha^{12}+\alpha^9+\alpha^5+\alpha^4+\alpha^2;$ $0x18c0=0*\alpha^{15}+0*\alpha^{14}+0*\alpha^{13}+1*\alpha^{12}+1*\alpha^{11}+0*\alpha^{10}+$
$0*\alpha^9+0*\alpha^8+1*\alpha^7+1*\alpha^6+0*\alpha^5+0*\alpha^4+0*\alpha^3+$
$0*\alpha^2+0*\alpha^1+0*\alpha^0=\alpha^{12}+\alpha^{11}\alpha+\alpha^7+\alpha^6;$ the coefficients represented by the polynomial representation are multiplied and expanded to obtain addition of different power exponents of $\alpha$:

$$0x1234*0x18c0 = (\alpha^{12}+\alpha^9+\alpha^5+\alpha^4+\alpha^2)*(\alpha^{12}+\alpha^{11}+\alpha^7+\alpha^6) =$$
$$\alpha^{24}+\alpha^{21}+\alpha^{17}+\alpha^{16}+\alpha^{14}+\alpha^{23}+\alpha^{20}+\alpha^{16}+\alpha^{15}+\alpha^{13}+\alpha^{19}+\alpha^{16}+$$
$$\alpha^{12}+\alpha^{11}+\alpha^9+\alpha^{18}+\alpha^{15}+\alpha^{11}+\alpha^{10}+\alpha^8 = \alpha^{24}+\alpha^{23}+\alpha^{21}+$$
$$\alpha^{20}+\alpha^{19}+\alpha^{18}+\alpha^{17}+\alpha^{16}+\alpha^{14}+\alpha^{13}+\alpha^{12}+\alpha^{10}+\alpha^9+\alpha^8 =$$

-continued
$$0x2d00 + 0x1680 + 0x5a0 + 0x2d0 + 0x168 + 0xb4 + 0x5a + 0x2d +$$
$$0x4000 + 0x2000 + 0x1000 + 0x400 + 0x200 + 0x100 = 0x4a5b;$$

the numerical values of the power exponents of $\alpha$ are found out through the lookup table $f(\alpha^j)$, and the coefficients of the remainder polynomial R(x), i.e., the code words of the redundant codes $T_n$, n=1, 2, . . . , 5, are calculated;

the remainder polynomial R(x) is obtained:

$$R(x)=0x15d4*x^4+0x2606*x^3+0x3587*x^2+0x417e*x^1+0x121c*x^0;$$

code words of the five redundant codes are 0x15d4, 0x2606, 0x3587, 0x417e, 0x121c;

the sending terminal sends five information data and five redundant codes 0x1234, 0x5678, 0x3245, 0xabcd, 0xef10, 0x15d4, 0x2606, 0x3587, 0x417e, 0x121c to the receiving terminal.

It is assumed that the third information data and the third redundant code received by the receiving terminal are in error, then the information data and the redundant codes received by the receiving terminal are 0x1234, 0x5678, 0xe305, 0xabcd, 0xef10, 0x15d4, 0x2606, 0xa513, 0x417e, 0x121c.

The code word polynomial Q(x) obtained by the receiving terminal according to the received information data and redundant codes is:

$$Q(x)=0x1234*x^9+0x5678*x^8+0xe305*x^7+0xabcd*x^6+0xef10*x^5+0x15d4*x^4+0x2606*x^3+0xa513*x^2+0x417e*x^1+0x121c*x^0.$$

The receiving terminal calculates five correctors $S_i$, where $S_i=Q(\alpha^i)$, i=1, 2, . . . , 5, specifically, $$S_1=Q(\alpha^1)=0xed82;$$

$$S_2=Q(\alpha^2)=0xc556;$$

$$S_3=Q(\alpha^3)=0x879a;$$

$$S_4=Q(\alpha^4)=0x4eb7;$$

$$S_5=Q(\alpha^5)=0x7cb9;$$

if not all of the correctors $S_i$ are equal to 0, then the location of the error information code and the correction value are calculated using the correctors $S_1$ to $S_{2s}$; specifically, calculation is performed according to the correctors to obtain the equation $SS_2 \cdot x^2 SS_1 \cdot x+SS_0=0$, and the root of the equation is the location of the error code.

Let $S_1=(S_1\ S_2)$, $S_2=(S_2\ S_3)$, $S_3=(S_3\ S_4)$, then $$SS_2=|S_1^T S_2^T|=S_2*S_2+S_1*S_3=0x219f;$$

$$SS_1=|S_1^T S_3^T|=S_4*S_1+S_3*S_2=0x4b2c;$$

$$SS_0=|S_2^T S_1^T|=S_4*S_2+S_3*S_3=0x3537;$$

then the equation is $0x219f \cdot x^2+0x4b2c \cdot x+0x3537=0$, and the solution to this equation is as follows:

the roots of the equation are represented by the polynomial representation, that is, x and $x^2$ are represented by the polynomial representation as:

$$x=x_{15}\alpha^{15}+x_{14}\alpha^{14}+x_{13}\alpha^{13}+x_{12}\alpha^{12}+x_{11}\alpha^{11}+x_{10}\alpha^{10}+x_9\alpha^9+x_8\alpha^8+x_7\alpha^7+x_6\alpha^6+x_5\alpha^5+x_4\alpha^4+x_3\alpha^3+x_2\alpha^2+x_1\alpha^1+x_0\alpha^0;$$

$$x^2=x_{15}\alpha^{30}+x_{14}\alpha^{28}+x_{13}\alpha^{26}+x_{12}\alpha^{24}+x_{11}\alpha^{22}+x_{10}\alpha^{20}+x_9\alpha^{18}+x_8\alpha^{16}+x_7\alpha^{14}+x_6\alpha^{12}+x_5\alpha^{10}+x_4\alpha^8+x_3\alpha^6+x_2\alpha^4+x_1\alpha^2+x_0\alpha^0;$$

where $x_i$ can only take 0 or 1, i=1, 2, . . . , 15;

the values of x and $x^2$ are brought into the left of the equation to obtain $$0x219f*x^2+0x4b2c*x+0x3537=0xe006x_{15}+0xe5c6x_{14}+0x1799x_{13}+0x1292x_{12}+0x2f1bx_{11}+0x1e19x_{10}+0x2d6cx_9+0xbe3dx_8+0x3537x_7+0x6d1fx_6+0xoeabx_5+0x28f9x_4+0x3f92x_3+0x3527x_2+0x1024x_1+0x6ab3$$

the exponents of $\alpha$ corresponding to the coefficients of $x_i$ are looked for in the lookup table $f(\alpha^j)$, and the left side of the equation is converted into the expression of the exponents of $\alpha$ and $x_i$, specifically:

$$0x219f*x^2+0x4b2c*x+0x3537=0xe006x_{15}+0xe5c6x_{14}+0x1799x_{13}+0x1292x_{12}+0x2f1bx_{11}+0x1e19x_{10}+0x2d6cx_9+0xbe3dx_8+0x3537x_7+0x6d1fx_6+0xoeabx_5+0x2819x_4+0x3f92x_3+0x3527x_2+0x1024x_1+0x6ab3x_0=(x_0+x_2+x_4+x_5+x_6+x_7+x_8+x_{10}+x_{11}+x_{13}+1)*\alpha^0+(x_0+x_2+x_3+x_5+x_6+x_7+x_{11}+x_{12}+x_{14}+x_{15}+1)*\alpha^1+(x_1+x_2+x_6+x_7+x_8+x^9+x_{14}+x_{15}+1)*\alpha^2+(x_4+x_5+x_6+x_8+x_9+x_{10}+x_{11}+x_{13}+0)*\alpha^3+(x_0+x_2+x_3+x_4+x_6+x_7+x_8+x_{10}+x_{11}+x_{12}+x_{13}+1)*\alpha^4+(x_0+x_1+x_2+x_4+x_5+x_7+x_8+x_9+1)*\alpha^5+(x_4+x_9+x_{14}+0)*\alpha^6+(x_0+x_3+x_4+x_5+x_{12}+x_{13}+x_{14}+0)*\alpha^7+(x_2+x_3+x_7+x_9+x_{11}+x_{13}+x_{14}+1)*\alpha^8+(x_0+x_3+x_5+x_8+x_{10}+x_{11}+x_{12}+x_{13}+0)*\alpha^9+(x_2+x_3+x_5+x_7+x_8+x_9+x_{10}+x_{11}+x_{13}+x_{14}+1)*\alpha^{10}+(x_0+x_3+x_4+x_5+x_8+x_9+x_{10}+x_{11}+0)*\alpha^{11}+(x_1+x_2+x_7+x_8+x_{10}+x_{12}+x_{13}+1)*\alpha^{12}+(x_0+x_2+x_3+x_4+x_6+x_7+x_8+x_9+x_{11}+x_{14}+x_{15}+0)*\alpha^{13}+(x_0+x_6+x_{14}+x_{15}+0)*\alpha^{14}+(x_8+x_{14}+x_{15}+0)*\alpha^{15};$$

let all the above coefficients of $\alpha^i$ be equal to 0, thus obtaining 16 equations:

$$x_0+x_2+x_4+x_5+x_6+x_7+x_8+x_{10}+x_{11}+x_{13}=1;$$

$$x_0+x_2+x_3+x_5+x_6+x_7+x_{11}+x_{12}+x_{14}+x_{15}=1;$$

$$x_1+x_2+x_6+x_7+x_8+x^9+x_{14}+x_{15}=1;$$

$$x_4+x_5+x_6+x_8+x_9+x_{10}+x_{11}+x_{13}=0;$$

$$x_0+x_2+x_3+x_4+x_6+x_7+x_8+x_{10}+x_{11}+x_{12}+x_{13}=1;$$

$$x_0+x_1+x_2+x_4+x_5+x_7+x_8+x_9=1;$$

$$x_4+x_9+x_{14}=0;$$

$$x_0+x_3+x_4+x_5+x_{12}+x_{13}+x_{14}=0;$$

$$x_2+x_2+x_7+x_9+x_{11}+x_{13}+x_{14}=1;$$

$$x_0+x_3+x_5+x_8+x_{10}+x_{11}+x_{12}+x_{13}=0;$$

$$x_2+x_3+x_5+x_7+x_8+x_9+x_{10}+x_{11}+x_{13}+x_{14}=1;$$

$$x_0+x_3+x_4+x_5+x_8+x_9+x_{10}+x_{11}=0;$$

$$x_1+x_2+x_3+x_7+x_8+x_{10}+x_{12}+x_{13}=1;$$

$$x_0+x_2+x_3+x_4+x_6+x_7+x_8+x_9+x_{11}+x_{14}+x_{15}=1;$$

$$x_0+x_6+x_{14}+x_{15}=0;$$

$$x_8+x_{14}+x_{15}=0$$

the above 16 equations are converted into a non-homogeneous linear equation set for $x_i$, and a matrix consisting of the coefficients of $x_i'$ and numerical values of constant terms is obtained:

$$\begin{bmatrix} 1 & 0 & 1 & 0 & 1 & 1 & 1 & 1 & 0 & 1 & 1 & 0 & 1 & 0 & 0 & 1 \\ 1 & 0 & 1 & 1 & 0 & 1 & 1 & 1 & 0 & 0 & 0 & 1 & 1 & 0 & 1 & 1 & 1 \\ 0 & 1 & 1 & 0 & 0 & 0 & 1 & 1 & 1 & 1 & 0 & 0 & 0 & 0 & 1 & 1 & 1 \\ 0 & 0 & 0 & 0 & 1 & 1 & 1 & 0 & 1 & 1 & 1 & 1 & 0 & 1 & 0 & 0 & 0 \\ 1 & 0 & 1 & 1 & 1 & 0 & 1 & 1 & 1 & 0 & 1 & 1 & 1 & 0 & 0 & 1 \\ 1 & 1 & 1 & 0 & 1 & 1 & 0 & 1 & 1 & 1 & 0 & 0 & 0 & 0 & 0 & 0 & 1 \\ 0 & 0 & 0 & 0 & 1 & 0 & 0 & 0 & 0 & 1 & 0 & 0 & 0 & 0 & 1 & 0 & 0 \\ 1 & 0 & 0 & 1 & 1 & 1 & 0 & 0 & 0 & 0 & 0 & 0 & 1 & 1 & 1 & 0 & 0 \\ 0 & 0 & 1 & 1 & 0 & 0 & 0 & 1 & 0 & 1 & 0 & 1 & 0 & 1 & 1 & 0 & 1 \\ 1 & 0 & 0 & 1 & 0 & 1 & 0 & 0 & 1 & 0 & 1 & 1 & 1 & 1 & 0 & 0 & 0 \\ 0 & 0 & 1 & 1 & 0 & 1 & 0 & 1 & 1 & 1 & 1 & 1 & 0 & 1 & 1 & 0 & 1 \\ 1 & 0 & 0 & 1 & 1 & 1 & 0 & 0 & 1 & 1 & 1 & 1 & 0 & 0 & 0 & 0 & 1 \\ 0 & 1 & 1 & 1 & 0 & 0 & 0 & 1 & 1 & 0 & 1 & 0 & 1 & 1 & 0 & 0 & 1 \\ 1 & 0 & 1 & 1 & 1 & 0 & 1 & 1 & 1 & 1 & 0 & 1 & 0 & 0 & 1 & 1 & 1 \\ 1 & 0 & 0 & 0 & 0 & 0 & 1 & 0 & 0 & 0 & 0 & 0 & 0 & 0 & 1 & 1 & 0 \\ 0 & 0 & 0 & 0 & 0 & 0 & 0 & 1 & 0 & 0 & 0 & 0 & 0 & 1 & 1 & 0 \end{bmatrix};$$

the above non-homogeneous linear equation set is solved to obtain $x_1=0x0004$, $x_2=0x0080$;

in the lookup table $f(\alpha^j)$, the locations corresponding to $x_1$ and $x_2$ are the second power of $\alpha$ and the seventh power of $\alpha$ respectively; thus, the locations of the error information codes in the code word polynomial $Q(x)$ are the coefficients corresponding to the second power and the seventh power of x, namely, 0xa513 and 0xe305.

If no values that are the same as the values of $x_1$ and $x_2$ are found in the lookup table $f(\alpha^j)$, the following method is used to find out the location of the error code, specifically:

in step S1, take $p=2*m-1=31$, $v=\alpha^{2m-1}=0x823e$;

in step S2, let $p=p+1$;

in step S3, if the highest data bit of v is 1, v is firstly shifted leftward by 1 bit, and then $v=v+0x1d$, where 0x1d is the numerical value obtained by bringing $x=\alpha$ into $x^5+x^3+x^2+1$ in the primitive polynomial $P(x)=x^{16}+x^5+x^3+x^2+1$;

if the highest data bit of v is 0, v is shifted leftward by 1 bit;

in step S4, the v obtained in step S3 is compared with $x_1$ or $x_2$ to see if they are equal:

if the v is equal to $x_1$ or $x_2$, the coefficient corresponding to the $p^{th}$ power of x in the code word polynomial $Q(x)$ is the location of the error information code; and If the v is not equal to $x_1$ or $x_2$, then turn to step S2 to continue the process.

The error value is calculated according to the following two equations:

$$S_1 = e_1 \cdot x_1 + e_2 \cdot x_2 = 0xed82;$$

$$S_2 = e_1 \cdot x_1^2 + e_2 \cdot x_2^2 = 0xc556;$$

values of $x_1$ and $x_2$ are brought into the above two equations to yield $e_1=0x9094$ and $e_2=0xd140$, specifically:
$S_1*x_1-S_2$ is calculated to yield $(x_1 \cdot x_2 - x_2^2) \cdot e_2 = 0xed82 - 0xc556$ $e_2$ is represented in polynomial representation as:

$$e_2 = x_{15}\alpha^{15} + x_{14}\alpha^{14} + x_{13}\alpha^{13} + x_{12}\alpha^{12} + x_{11}\alpha^{11} + x_{10}\alpha^{10} + x_9\alpha^9 + x_8\alpha^8 + x_7\alpha^7 + x_6\alpha^6 + x_5\alpha^5 + x_4\alpha^4 + x_3\alpha^3 + x_2\alpha^2 + x_1\alpha^1 + x_0\alpha^0;$$

where $x_i$ can only take 0 or 1, $i=1, 2, \ldots, 15$;
the value of $e_2$ is brought into $(x_1 \cdot x_2 - x_2^2) \cdot e_2 = 0xed82 - 0xc556$ to obtain the non-homogeneous linear equation set and yield $e_2 = 0xd140$;
and in a similar principle, yield $e_1 = 0x9094$;

the correction value is added to the code word at the location of the error information code received by the receiving terminal to obtain error-corrected code word, specifically:

in the error-corrected code word polynomial $Q(x)$, the coefficient of the second power of x is: 0xa513+0x9094=0x3587, and the coefficient of the seventh power of x is: 0xe305+0xd140=0x3245;

the value of the error-corrected code word is assigned to the code word at the location of the error information code so as to obtain the error-corrected code word polynomial $Q(x)$ as follows:

$$Q(x)=0x1234*x^9+0x5678*x^8+0x3245*x^7+0xabcd*x^6+ 0xef10*x^5+0x15d4*x^4+0x2606*x^3+0x3587*x^2+ 0x417e*x^1+0x121c*x^0$$

$S_5=Q(\alpha^5)$ is recalculated, and if $S_5=0$ is yielded, the error correction is successful.

To sum up, in the RS error correction decoding method according to the present invention, a lookup table $f(\alpha^j)$ for different power exponents of $\alpha$ is established, where j is selected from all the integers ranging from 0 to 2m-1, and with a total number of 2m, for the calculation of the coefficients of the generator polynomial $G(x)$ and the coefficients of the remainder polynomial $R(x)$ obtained by dividing the code word polynomial $Q(x)$ by the generator polynomial $G(x)$, thus greatly saving system memory; one additional redundant code is taken in encoding, for the purpose of checking the data obtained after the error correction decoding, thereby improving correctness and stability of the system.

What is claimed is:

1. A Reed-Solomon (RS) error correction decoding method, characterized in that, when encoding at a sending terminal, code words of information data are represented by $K_l$, code words of redundant codes are represented by $T_n$, the order of primitive polynomial $P(x)$ is m, a generator polynomial in $GF(2^m)$ is $G(x)$, and an error correction code is represented by (c, k, t), wherein c is the total length of the information data and the redundant code, k is the length of the information data, and t is the length of the redundant code, then the code word polynomial $Q(x)$ is represented as $$Q(x) = \sum_{l=t}^{t+k-1} K_l \cdot x^l + \sum_{n=0}^{t-1} T_n \cdot x^n;$$

root of the m-order primitive polynomial $P(x)$ is primitive field element in $GF(2^m)$, and the primitive field element is represented by $\alpha$, thus the generator polynomial $G(x)$ is represented as $$G(x) = \prod_{i=1}^{t} (x - \alpha^i);$$

a lookup table $f(\alpha^j)$ is established for different power exponents of $\alpha$, wherein the value of j is selected from all the integers ranging from 0 to 2m-1, with a total number of 2m;

the generator polynomial $G(x)$ is expanded to obtain a polynomial with respect to x, wherein the coefficients of the generator polynomial $G(x)$ are the addition or subtraction of the power exponents of $\alpha$;

numerical values of the different power exponents of α are found out through the lookup table $f(\alpha^j)$ and the coefficients of the generator polynomial $G(x)$ are calculated;

it is assumed that the code words $T_n$ of the redundant codes are all 0, then a code word polynomial $$Q(x) = \sum_{l=t}^{t+k-1} K_l \cdot x^l$$

is obtained;

the code word polynomial $Q(x)$ is divided by the generator polynomial $G(x)$ to obtain a remainder polynomial $$R(x) = \sum_{i=0}^{2s} T_i \cdot x_i;$$

the coefficients Ti of $R(x)$ are the addition or subtraction of the power exponents of α;

numerical values of the power exponents of α are found out through the lookup table $f(\alpha^j)$, and the coefficients of the remainder polynomial $R(x)$ are calculated, namely, the code words Tn of the redundant codes;

wherein the error correction decoding process includes:

assuming that s is the maximum number of error correction bits of the receiving terminal, let $t=2s+1$;

dividing the code word polynomial $Q(x)$ by the generator polynomial $G(x)$ to obtain the remainder polynomial $R(x)$, $$R(x) = \sum_{i=0}^{2s} T_i \cdot x_i;$$

calculating the coefficients of the remainder polynomial $R(x)$, thus obtaining the code words $T_n$ of $2s+1$ redundant codes, $n=1, 2, \ldots, 2s+1$;

sending, by the sending terminal, information data and $2s+1$ redundant codes to the receiving terminal;

receiving, by the receiving terminal, the information data and $2s+1$ redundant codes;

obtaining, by the receiving terminal, the code word polynomial $Q(x)$ according to the received information data and $2s+1$ redundant codes, and the code word polynomial $Q(x)$ being represented as:

$$Q(x) = \sum_{l=2s+1}^{2s+k} K_l \cdot x^l + \sum_{n=0}^{2s} T_n \cdot x^n;$$

calculating, by the receiving terminal, $2s+1$ correctors $S_i$, wherein $S_i = Q(\alpha^j)$, $i=1, 2, \ldots, 2s+1$;

calculating a location of an error information code and a correction value using correctors $S_1$ to $S_{2s}$, if not all of the correctors $S_i$ are equal to 0;

adding the correction value to the code word at the location of the error information code received by the receiving terminal to obtain an error-corrected code word;

assigning the value of the error-corrected code word to the code word at the location of the error information code;

recalculating $S_{2s+1} = Q(\alpha^{2s+1})$, wherein if $S_{2s+1}=0$, the error correction is successful.

2. The RS error correction decoding method according to claim 1, wherein in the process of obtaining the remainder polynomial $R(x)$ by dividing the code word polynomial $Q(x)$ by the generator polynomial $G(x)$, multiplication of the coefficients of x is performed, and the multiplication operation is converted into addition operation specifically as follows:

representing the coefficients of x by a polynomial representation;

multiplying and expanding the coefficients represented by the polynomial representation to obtain an addition of different power exponents of α;

finding out the numerical values of the different power exponents of α through the lookup table $f(\alpha^j)$ to solve the addition.

3. The RS error correction decoding method according to claim 1, wherein the process of calculating the location of the error information code using the correctors $S_1$ to $S_{2s}$ is specifically performed as follows:

calculating according to the correctors to obtain an equation taking the location of the error information code as a root;

representing the root of the equation by a polynomial representation, with standard bases being different power exponents of α and coefficients being values of $X_i$, wherein $i=0, 1, \ldots, m$;

representing the coefficients of the equation by the polynomial representation, with standard bases being different power exponents of α;

bringing the root and coefficients represented by the polynomial representation into the polynomial of the equation;

letting the coefficient of each term of the polynomial be zero, thus obtaining a non-homogeneous linear equation set for $x_i$;

solving the non-homogeneous linear equation set to obtain the value of $x_i$;

substituting the value of $x_i$ into the root represented by the polynomial representation to obtain by calculation the root of the equation so as to obtain the location of the error information code;

looking for the location in the code word polynomial $Q(x)$ corresponding to the location of the error information code.

4. The RS error correction decoding method according to claim 3, wherein looking for the location in the code word polynomial $Q(x)$ corresponding to the location of the error information code specifically includes:

finding out the numerical value in the lookup table $f(\alpha^j)$ that is the same as the value of the error information code, the coefficient at the location where the exponent value of x in the polynomial $Q(x)$ is equal to the exponent value of α corresponding to the numerical value is the location in the code word polynomial $Q(x)$ corresponding to the error information code;

if the numerical value that is the same as the value of the error information code is not found in the lookup table $f(\alpha^j)$, the following method is used to find out the location of the error information code, specifically:

S1, taking $p=2*m-1=31$, $v=\alpha^{2m-1}$;

S2, letting $p=p+1$;

S3, if the highest data bit of v is 1, shifting v leftward by 1 bit firstly, and then $v=v+v_0$, wherein $v_0$ is the numerical value obtained by bringing $x=\alpha$ into the primitive polynomial $P(x)$ except for the term of the highest power of x;

if the highest data bit of v is 0, shifting v leftward by 1 bit;

S4, comparing the v obtained in step S3 with the error information code to see whether they are equal:

If the v is equal to the error information code, the coefficient corresponding to the $p^{th}$ power of x in the code word polynomial $Q(x)$ is the location of the error information code, If the v is not equal to the error information code, then turn to step S2 to continue the process.

5. The RS error correction decoding method according to claim 3, wherein calculating the correction value using the correctors $S_1$ to $S_{2s}$ is specifically as follows:

obtaining a equation set consisting of the location of the error information code and the correction value, wherein the error information code is the root of the equation set, and the correction value is an unknown number of the equation set;

representing the correction value of the equation set by the polynomial representation, with standard bases being different power exponents of $\alpha$, and coefficients being values of $x_i$, i=0, 1, . . . , m;

representing the location of the error information code of the equation set by the polynomial representation, with standard bases being different power exponents of $\alpha$;

bringing the correction value and coefficients represented by the polynomial representations into the polynomial of the equation set;

letting the coefficient of each term of the polynomial be zero, thus obtaining a non-homogeneous linear equation set for $x_i$;

solving the non-homogeneous linear equation set to obtain the value of $x_i$;

bringing the value of $x_i$ into the correction value represented by the polynomial representation to obtain by calculation the root of the equation set so as to obtain the correction value.

\* \* \* \* \*